(12) United States Patent
Sato et al.

(10) Patent No.: US 12,150,297 B2
(45) Date of Patent: Nov. 19, 2024

(54) THIN FILM TRANSISTORS HAVING A BACKSIDE CHANNEL CONTACT FOR HIGH DENSITY MEMORY

(71) Applicant: Intel Corporation, Santa Clara, CA (US)

(72) Inventors: Noriyuki Sato, Hillsboro, OR (US); Sarah Atanasov, Beaverton, OR (US); Abhishek A. Sharma, Hillsboro, OR (US); Bernhard Sell, Portland, OR (US); Chieh-Jen Ku, Hillsboro, OR (US); Arnab Sen Gupta, Hillsboro, OR (US); Matthew V. Metz, Portland, OR (US); Elliot N. Tan, Portland, OR (US); Hui Jae Yoo, Portland, OR (US); Travis W. Lajoie, Forest Grove, OR (US); Van H. Le, Portland, OR (US); Pei-Hua Wang, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 818 days.

(21) Appl. No.: 17/129,869

(22) Filed: Dec. 21, 2020

(65) Prior Publication Data

US 2022/0199628 A1    Jun. 23, 2022

(51) Int. Cl.
*H10B 12/00*    (2023.01)
*H01L 29/786*    (2006.01)

(52) U.S. Cl.
CPC ..... *H10B 12/485* (2023.02); *H01L 29/78696* (2013.01); *H10B 12/0335* (2023.02); *H10B 12/05* (2023.02); *H10B 12/315* (2023.02); *H10B 12/482* (2023.02); *H10B 12/488* (2023.02)

(58) Field of Classification Search
None
See application file for complete search history.

(56) References Cited

U.S. PATENT DOCUMENTS

| 6,331,479 | B1 * | 12/2001 | Li | H01L 21/7681 |
| | | | | 438/618 |
| 9,306,022 | B1 | 4/2016 | Oh | |
| 2011/0111568 | A1 | 5/2011 | Kim | |
| 2012/0018799 | A1 | 1/2012 | Park | |
| 2012/0120709 | A1 * | 5/2012 | Mihnea | G11C 13/0069 |
| | | | | 438/238 |

(Continued)

OTHER PUBLICATIONS

Search Report from European Patent Application No. 21194975.5, mailed Mar. 2, 2022, 8 pgs.

*Primary Examiner* — Bo B Jang
(74) *Attorney, Agent, or Firm* — Schwabe, Williamson & Wyatt P.C.

(57) ABSTRACT

An integrated circuit (IC) structure in a memory device is described. In an example, the IC structure includes a memory cell including a bitline (BL) extending along a first direction and a channel extending along a second direction above and diagonal to the BL. In the example, a wordline (WL) extends in a third direction perpendicular to the first direction of the BL and intersects with the channel to control a current in the channel along a gated channel length. In some examples, the channel is electrically coupled on a first side to a storage capacitor via a storage node contact (SNC) and on a second side to the BL via a bit line contact (BLC) located on an underside or backside of the channel.

20 Claims, 7 Drawing Sheets

(56) References Cited

U.S. PATENT DOCUMENTS

2014/0231914 A1* 8/2014 Chang .............. H01L 29/66545
                                              438/151
2015/0041888 A1   2/2015 Kim

* cited by examiner

THIN FILM TRANSISTORS HAVING A BACKSIDE CHANNEL CONTACT FOR HIGH DENSITY MEMORY

TECHNICAL FIELD

Embodiments of the disclosure are in the field of integrated circuit structures and, in particular, thin film transistors in memory cells having a backside channel contact.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. For example, in the conventional manufacture of dynamic random-access memory (DRAM), various challenges may occur related to increased density, such as for example, space constraints due to capacitor reliability and interference between cells.

DESCRIPTION OF THE EMBODIMENTS

Figure 1:
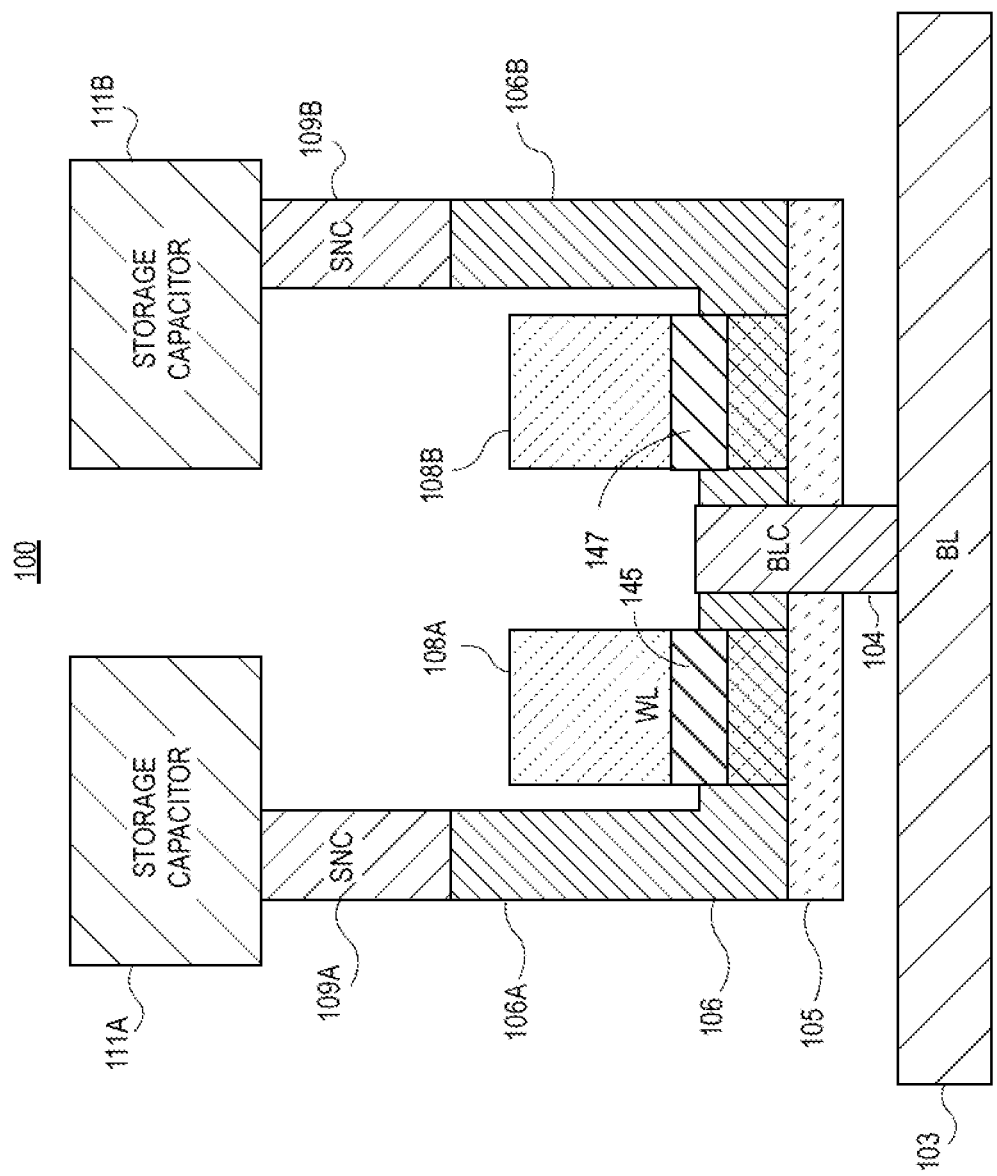
FIG. 1 illustrates a cross-sectional view of an integrated circuit (IC) structure having a memory cell architecture having a bit line contact (BLC) located on an underside or a backside of a channel of a thin film transistor, in accordance with an embodiment of the present disclosure.

An integrated circuit (IC) structure having a bit line contact (BLC) located on an underside or a backside of a channel is described. In embodiments, the channel is located proximal to or above a bit line (BL) in a 1 Transistor-1 Capacitor (1T-1C) memory cell of a memory device. In some embodiments, the BL is formed in a backend interlayer dielectric (ILD) stack of the memory device. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "under" (e.g., "underside" or "backside") "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Advantages to implementing embodiments described herein can include the ability to achieve greater memory cell density while maintaining transistor, e.g., thin-film transistor (TFT) performance. In embodiments, a bit line contact (BLC) on an underside or a backside of a channel couples to a bit line (BL) that is located beneath the channel of a TFT in a memory array. In embodiments, the memory device includes a one transistor-one capacitor (1T-1C) memory device such as DRAM.

In embodiments, a location of the BL under the channel in the substrate (or on a higher backend layer of a memory array) allows the BL and a storage node contact (SNC) to be located at different levels or heights in the substrate or the ILD of the backend layer, allowing for less constrained space around the BL and the SNC. In embodiments, a word line (WL) pitch/bit line (BL) pitch ratio can be selected that allows for a longer gated channel length (e.g., L1 as will be discussed below) of a thin film transistor in a memory cell as compared to structures having a similar memory cell area.

Referring now to FIG. 1, which illustrates a cross-sectional view of an integrated circuit (IC) structure 100 having a memory cell architecture having a bit line contact (BLC) on an underside or a backside of a channel, in accordance with an embodiment of the present disclosure. Note that underside or backside of the channel may refer to an underside of the channel relative to a frontside of the channel including, e.g., a gate oxide of the channel. The cross-sectional view of FIG. 1 is taken along a ("gate length") of a channel of a transistor (shown and discussed in more detail with respect to FIG. 2A) of a memory device. In FIG. 1, a bit line (BL) 103 is formed extending along a first direction. In the embodiment, a channel 106 extends along a second (diagonal) direction above BL 103. In some embodiments, channel layer 106 is deposited as a layer of channel material in a substrate such as a silicon substrate. In other embodiments, channel layer is deposited or formed in a higher backend layer of a memory array (e.g., Metal 4 (M4) or Metal 5 (M5)).

In the embodiment, an etch stop (ES) layer 105 is located under the channel layer 106. Word lines (WLs) 108A and 108B extend in a third direction (coming out of the page), perpendicular to the first direction of BL 103. In the embodiment, WL 108A intersects with channel layer 106 to control the channel along a gated channel length (shown in more detail with respect to FIG. 2). Note that a gate oxide is shown at 145 (and 147). Furthermore, channel layer 106 changes direction to run vertically along a portion 106A to electrically couple on a first or upper side to a storage capacitor 111A via a storage node contact (SNC) 109A. Similarly, WL 108B also intersects with channel layer 106 to control the channel along a gated channel length (shown in more detail with respect to FIG. 2). As shown, channel layer 106 changes direction to run vertically along a portion 106B to electrically couple on a first or upper side to a storage capacitor 111B via a storage node contact (SNC) 109B.

As shown in FIG. 1, channel layer 106 is electrically coupled on a second side or underside to a bit line contact (BLC) 104 to couple to BL 103 located below channel layer 106. Note that a first side or frontside of channel layer 106 may be considered a side facing storage capacitor 111A or 111B (or including gate oxides 145 and 147). In some embodiments, channel layer 106 includes a channel material deposited over a substrate such as a silicon substrate, e.g., crystalline silicon. In embodiments, channel layer 106 includes a channel material deposited over the silicon substrate. In various embodiments, the memory architecture described herein is made possible due to channel materials that can be deposited over, e.g., crystalline silicon, or other foundation of the IC structure.

In embodiments, the channel material includes one or more of an amorphous silicon, polycrystalline silicon (poly-Si) polycrystalline germanium (poly-Ge), polycrystalline silicon germanium (poly-SiGe), gallium nitride (GaN), indium gallium arsenide (In GaAs), transition metal dichalcogenides like tungsten disulfide ($WS_2$), indium selenide (InSe), molybdenum disulfide ($MoS_2$), molybdenum selenide ($MoSe_2$), black-phosphorus (phosphorene), oxide semiconductors like IGZO (indium gallium zinc oxide), indium oxide ($In_2O_3$), zinc oxide (ZnO), copper oxide ($Cu_2O$), tin oxide (SnOx), and indium tungsten oxide (IWO).

Figure 2A:
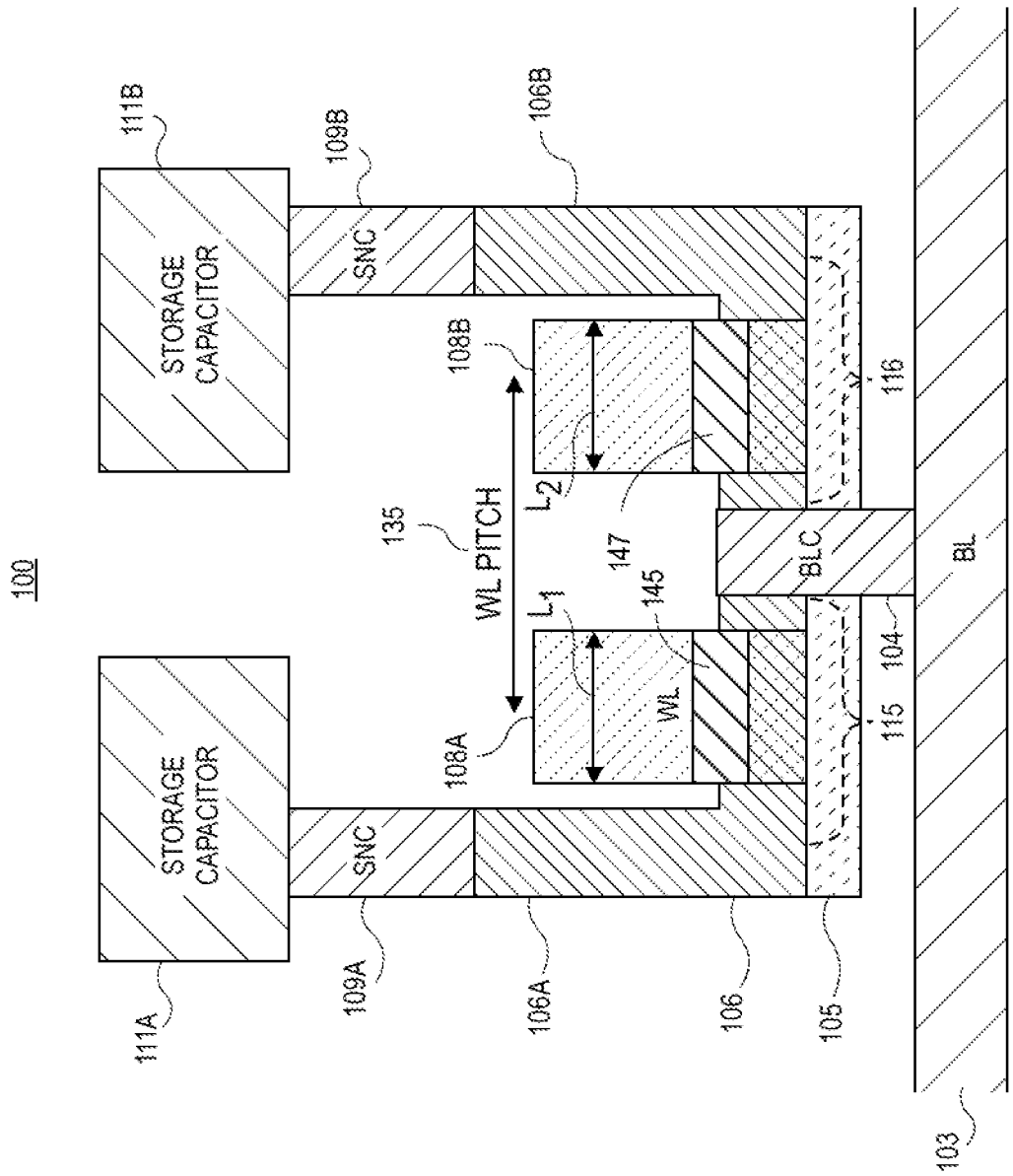
FIGS. 2A and 2B illustrate a respective cross-sectional view and corresponding top view of the IC structure of FIG. 1, in accordance with an embodiment of the present disclosure.
Figure 2B:
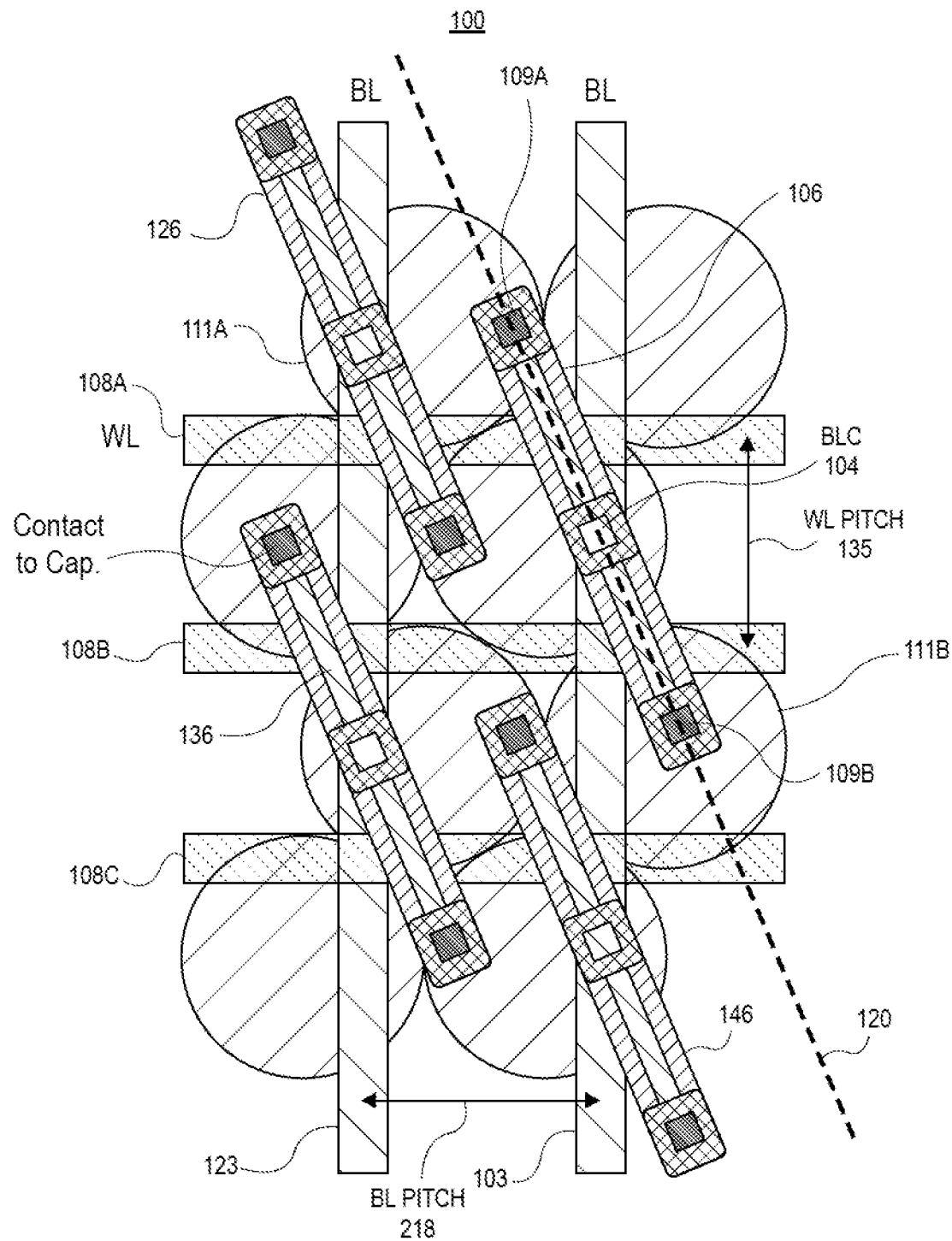

FIGS. 2A and 2B respectively illustrate a cross-sectional view and corresponding top view of the IC structure of FIG. 1, in accordance with an embodiment of the present disclosure. FIG. 2A illustrates IC structure 100 of FIG. 1, shown in more detail. The cross-sectional view of FIG. 2A is taken at a cut along dotted line 120 shown in FIG. 2B as along a channel length of IC structure 100.

As shown in FIGS. 2A and 2B, BL 103 extends along a first direction. The top view shown in 2B, also includes a second BL 123 (not visible in FIG. 2A) parallel to BL 103. In embodiments, BL 103 is a first BL and BL 123 is a second BL included in a plurality of BLs in a memory array, e.g. DRAM memory array. In FIGS. 2A and 2B, a horizontal portion of a channel layer 106 extends along a second direction (diagonal) above BL 103. FIGS. 2A and 2B both include an arrow 135 illustrating an example WL Pitch between WLs 108A and 108B. In FIG. 2B, a BL pitch between BL 103 and 123 is indicated by arrow 218.

As noted previously, WL 108A intersects with channel layer 106 to control a gated channel length (e.g., L1) of a first transistor 115. Similarly, in the embodiment, WL 108B intersects with channel layer 106 to control a gated channel length (e.g., L2) of a second transistor 116. Note that first and second transistor 115 and 116 are shown/labeled only in the viewpoint of FIG. 2A. Note that certain elements of transistors 115 and 116 (e.g., gate electrode, source and drain regions, etc.) have not been shown or described in order not to obscure the Figures.

In FIG. 2B, a plurality of channel layers (e.g., channel layers 106, 126, 136, and 146) are shown, running diagonal to BL 103 and 123. In the embodiment, a plurality of capacitors, only a few of which are labeled in order not to obscure the Figure (e.g., capacitors 111A and 111B) are shown in the top view of FIG. 2B.

As seen in FIG. 2B, WLs 108A, 108B, and 108C extend in a third direction, perpendicular to the first direction of the BLs, e.g., BLs 103 and 123. In the embodiment, WLs 108A, 108B, and 108C intersect with a corresponding portion of a channel of e.g., of channel layers 106, 126, 136, and 146, to control corresponding channels along a gated channel length. For example, WL 108A intersects with channel layer 106 to control a current along a gated channel length (e.g., L1)) of a transistor 115 (visible in the view of FIG. 2A).

Channel layer 106 is electrically coupled on a first or upper side to storage capacitors 111A and 111B via respective storage node contacts (SNC) (e.g., SNCs 109A and 109B). Channel layer 106 is electrically coupled on a second side via a bit line contact (BLC) 104 to couple with BL 103 located on an underside or backside of channel 106. Note that although additional SNCs and BLCs are shown coupled to transistors including channel layers, e.g., 126, 136, and 146, they have not been labeled in order not to obscure FIG. 2B.

Note that the BL and the SNC must be electrically isolated from each other which requires additional space around the BL and SNC. For example, an inter-layer dielectric (ILD) including an oxide and an insulator is formed to surround the metal and/or metal contacts of each of the BL and the SNC. Accordingly, high density of memory cells may be difficult to achieve when the BL and SNC are located at a similar level in an IC structure. As alluded to previously, a location of the BL under the channel (relative to gate/gate oxide) allows the BL and a storage node contact (SNC) to be located at different levels or heights, allowing for less constrained space around the BL and the SNC. In embodiments, a word line (WL) pitch/bit line (BL) pitch ratio can be selected that allows for a longer gated channel length (e.g., L1 and L2) of a thin film transistor (TFT) in a memory cell as compared to memory cells with a similar area. In some embodiments, a WL/BL pitch ratio includes a ratio of 0.87 or other suitable ratio that allows for a longer gated channel length than of a conventional structure of the same memory cell area.

Figure 3:
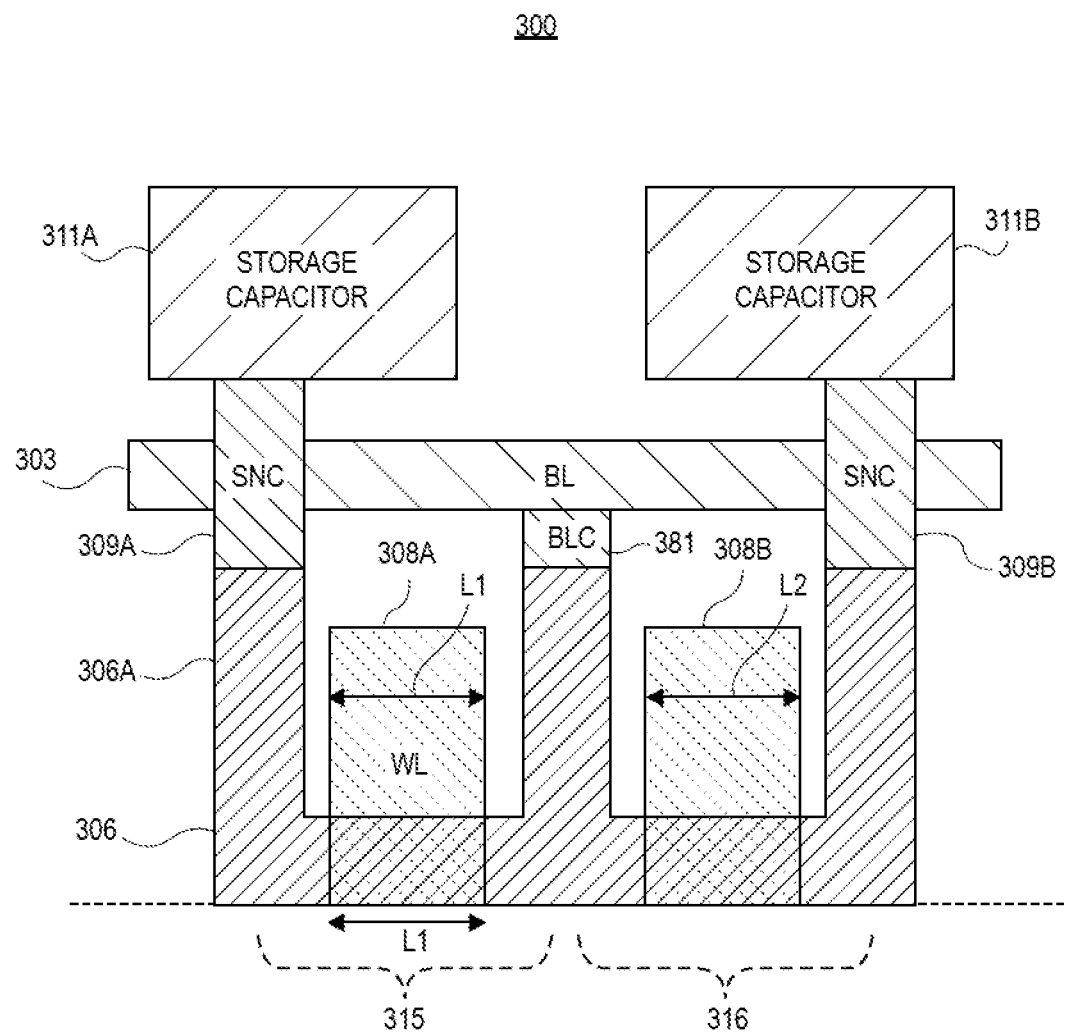
FIG. 3 illustrates a cross-sectional view of an IC structure having a memory cell architecture having a bit line contact (BLC) to couple with a bit line (BL) located above a channel of a thin film transistor, in accordance with an example of the present disclosure.

Referring now to FIG. 3, which illustrates a cross-sectional view of an IC structure having a memory cell architecture having a bit line contact (BLC) on a first or upper side of a channel, in accordance with an example of the present disclosure. The cross-sectional view of FIG. 1 is taken along a ("gate length") of a channel of an embodiment of a portion 300 of a memory device. In contrast with FIG. 1 (and FIGS. 2A and 2B), in FIG. 3, a bit line (BL) 303 is formed above a channel layer 306. In the example, a channel layer 306 extends along a second (diagonal) direction and is located below BL 303.

Word lines (WLs) 308A and 308B extend in a third direction (coming out of the page), perpendicular to the first direction of BL 303. In the embodiment, for example, WL 308A intersects with channel layer 306 to control the channel or channel layer 306 along a gated channel length (e.g., L1) of a first transistor 315. As shown, channel layer 306 changes direction to run vertically along a portion 306A to electrically couple on a first or upper side to a storage capacitor 311A via a storage node contact (SNC) 309A. Similarly, WL 308B intersects with channel layer 306 to control the channel or channel layer 306 along a gated channel length (e.g., L2) of a second transistor 316. As shown, channel layer 306 changes direction to run vertically along a portion 306B to electrically couple on a first or upper side to a storage capacitor 311B via a storage node contact (SNC) 309B.

In the embodiment, a bit line contact (BLC) 381 and SNCs 309A and 309B are located above channel layer 306 to couple to BL 303. Note that in the embodiment of FIG. 3, BL 303 and SNCs 309A and 309B are located at a same height or level, thus requiring more space than in, e.g., the embodiment of FIGS. 1 and 2, where the BL is located under a channel or channel layer.

Figure 4:
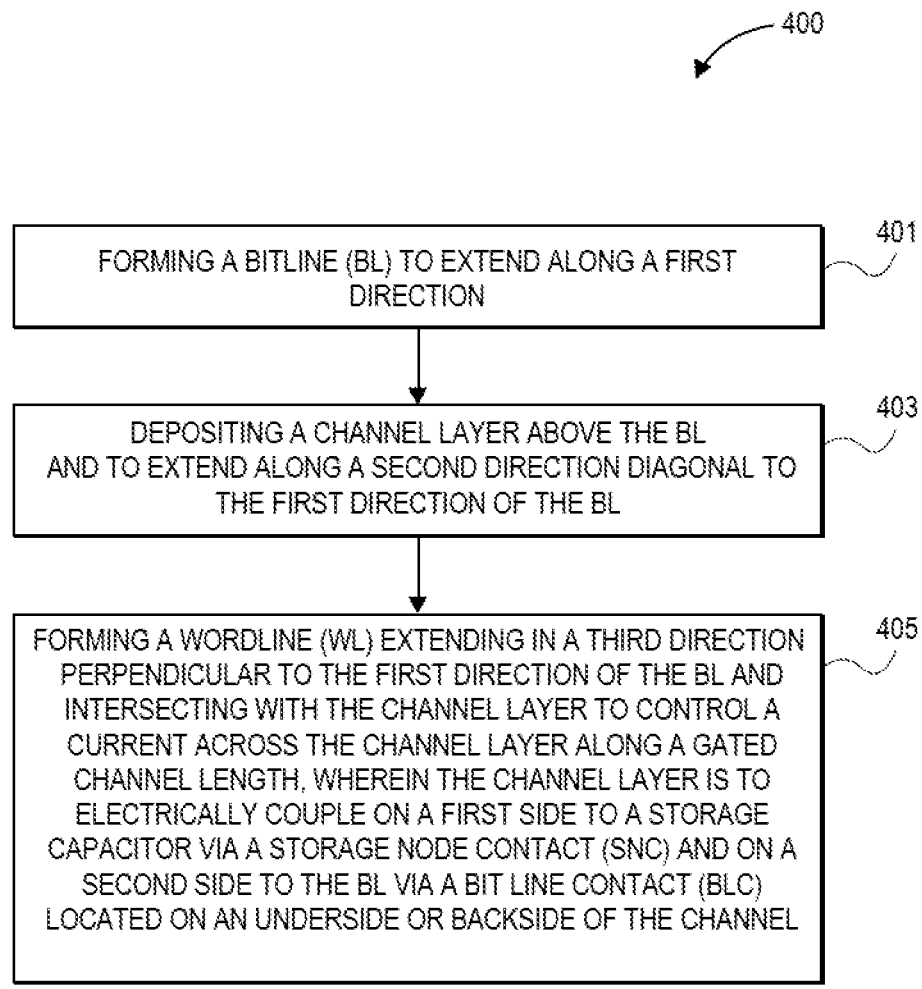
FIG. 4 is a flow diagram associated with the embodiments of FIGS. 1 and 2A and 2B, in accordance with an embodiment of the present disclosure.

Referring now to FIG. 4, which is a flow diagram illustrating a method associated with forming the integrated circuit structure 100 of FIG. 1 and FIG. 2, in accordance with embodiments of the present disclosure. At beginning block 401, method 400 includes forming a BL (e.g., BL 103 of FIG. 1) to extend along a first direction. In embodiments, the BL can be formed of any suitable electrically conductive material or combination of electrically conductive materials (such as, but not limited to, tungsten, tantalum, copper, ruthenium, titanium nitride (TiN), tantalum nitride (TaN), covered by an isolating material or dielectric. In embodiments, at a next block 403, method 400 includes forming or depositing a channel layer above the BL. In embodiments the channel layer extends along a second direction diagonal to the first direction of the BL. For example, depositing the channel layer above the BL over a substrate may include depositing amorphous silicon or other channel materials, as noted above, over a silicon substrate. In some embodiments, method 400 includes depositing and ES layer over the substrate, prior to depositing the channel layer.

At a block 405, method 400 includes forming a WL extending in a third direction perpendicular to the first direction of the BL and intersecting with the channel layer to control the channel layer (a current in the channel layer) along a gated channel length. In embodiments, the channel layer is electrically coupled on a first side to a storage capacitor via a storage node contact (SNC) above both the BL and the WL and on a second side to the BL via a bit line contact (BLC) located on an underside or backside of the channel layer.

Note that implementations of embodiments of the invention as described in FIGS. 1-4 may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.5 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.5 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
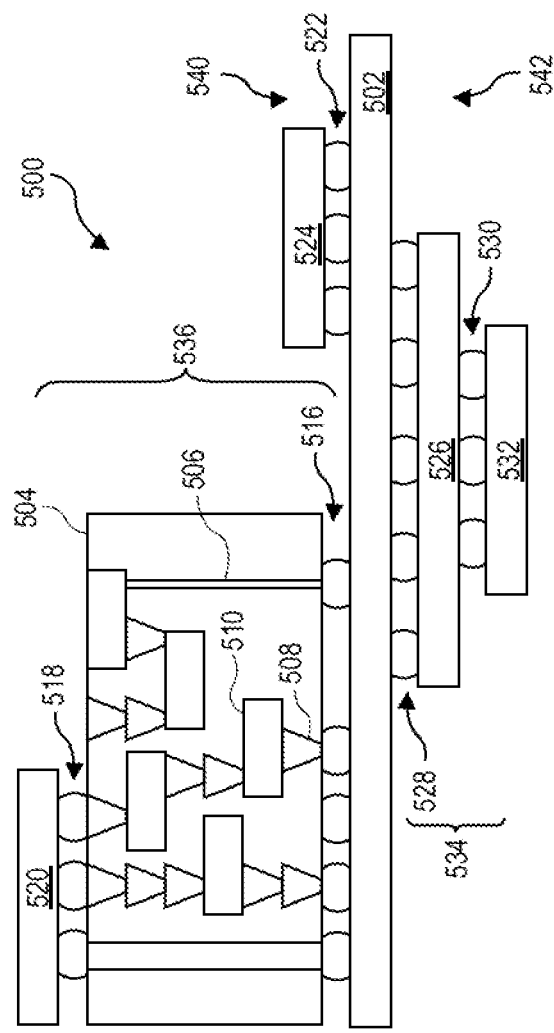
FIG. 5 is a cross-sectional side view of an integrated circuit (IC) device assembly that may include one or more thin film transistors having a bit line contact (BLC) located on an underside or a backside of a channel, in accordance with one or more of the embodiments disclosed herein.

FIG. 5 is a cross-sectional side view of an integrated circuit (IC) device assembly that may include one or more thin film transistors having a bit line contact (BLC) located on an underside or a backside of a channel of a thin film transistor, in accordance with one or more of the embodiments disclosed herein.

Referring to FIG. 5, an IC device assembly 500 includes components having one or more integrated circuit structures described herein. The IC device assembly 500 includes a number of components disposed on a circuit board 502 (which may be, e.g., a motherboard). The IC device assembly 500 includes components disposed on a first face 540 of the circuit board 502 and an opposing second face 542 of the circuit board 502. Generally, components may be disposed on one or both faces 540 and 542. In particular, any suitable ones of the components of the IC device assembly 500 may include a number of the TFT structures disclosed herein.

In some embodiments, the circuit board 502 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 502. In other embodiments, the circuit board 502 may be a non-PCB substrate.

The IC device assembly 500 illustrated in FIG. 5 includes a package-on-interposer structure 536 coupled to the first face 540 of the circuit board 502 by coupling components 516. The coupling components 516 may electrically and mechanically couple the package-on-interposer structure 536 to the circuit board 502, and may include solder balls (as shown in FIG. 5), male and female portions of a socket, an adhesive, an underfill material, and/or any other suitable electrical and/or mechanical coupling structure.

The package-on-interposer structure 536 may include an IC package 520 coupled to an interposer 504 by coupling components 518. The coupling components 518 may take any suitable form for the application, such as the forms discussed above with reference to the coupling components 516. Although a single IC package 520 is shown in FIG. 5, multiple IC packages may be coupled to the interposer 504. It is to be appreciated that additional interposers may be coupled to the interposer 504. The interposer 504 may provide an intervening substrate used to bridge the circuit board 502 and the IC package 520. The IC package 520 may be or include, for example, a memory die including an IC structure, e.g., IC structure 100 of FIGS. 1 and 2, or any other suitable component. Generally, the interposer 504 may spread a connection to a wider pitch or reroute a connection to a different connection. For example, the interposer 504 may couple the IC package 520 (e.g., a die) to a ball grid array (BGA) of the coupling components 516 for coupling to the circuit board 502. In the embodiment illustrated in FIG. 5, the IC package 520 and the circuit board 502 are attached to opposing sides of the interposer 504. In other embodiments, the IC package 520 and the circuit board 502 may be attached to a same side of the interposer 504. In some embodiments, three or more components may be interconnected by way of the interposer 504.

The interposer 504 may be formed of an epoxy resin, a fiberglass-reinforced epoxy resin, a ceramic material, or a polymer material such as polyimide. In some implementations, the interposer 504 may be formed of alternate rigid or flexible materials that may include the same materials described above for use in a semiconductor substrate, such as silicon, germanium, and other group III-V and group IV materials. The interposer 504 may include metal interconnects 508 and vias 510, including but not limited to through-silicon vias (TSVs) 506. The interposer 504 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 504. The package-on-interposer structure 536 may take the form of any of the package-on-interposer structures known in the art.

The IC device assembly 500 may include an IC package 524 coupled to the first face 540 of the circuit board 502 by coupling components 522. The coupling components 522 may take the form of any of the embodiments discussed above with reference to the coupling components 516, and the IC package 524 may take the form of any of the embodiments discussed above with reference to the IC package 520.

The IC device assembly 500 illustrated in FIG. 5 includes a package-on-package structure 534 coupled to the second face 542 of the circuit board 502 by coupling components 528. The package-on-package structure 534 may include an IC package 526 and an IC package 532 coupled together by coupling components 530 such that the IC package 526 is disposed between the circuit board 502 and the IC package 532. The coupling components 528 and 530 may take the form of any of the embodiments of the coupling components 516 discussed above, and the IC packages 526 and 532 may take the form of any of the embodiments of the IC package 520 discussed above. The package-on-package structure 534 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
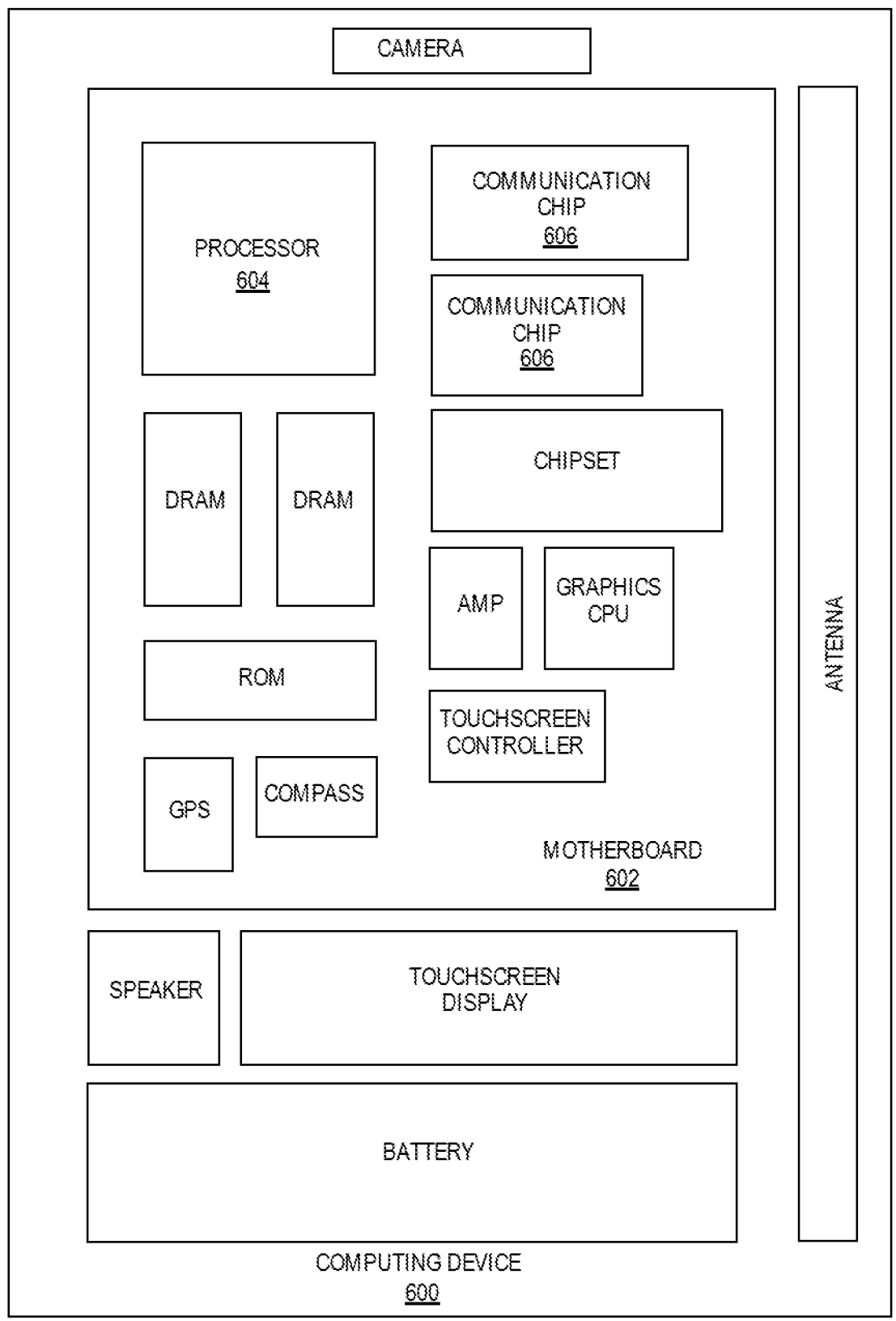
FIG. 6 illustrates a computing device in accordance with one implementation of an embodiment of the disclosure.

FIG. 6 illustrates a computing device 600 in accordance with one implementation of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM as shown in the Figure and including the IC structures 100 and 300 of FIGS. 1-3), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The processor may be coupled to a memory device having a memory cell architecture having a bit line contact (BLC) on an underside or a backside of a channel, in accordance with an embodiment of the present disclosure. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1 includes an integrated circuit (IC) structure in a memory device, comprising: a bitline (BL) extending in a first direction; a channel extending in a second diagonal direction to the BL; a wordline (WL) extending in a third direction perpendicular to the first direction of the BL and intersecting with the channel to control the channel along a gated channel length, wherein the channel is electrically coupled on a first side to a storage capacitor via a storage node contact (SNC) and on a second side to the BL via a bit line contact (BLC) located on an underside or backside of the channel.

Example 2 includes the IC structure of Example 1, wherein the IC structure comprises a 1 Transistor-1 Capacitor (1T-1C) memory cell of a DRAM memory array.

Example 3 includes the IC structure of Example 2, wherein the storage node contact (SNC) is above the BL and the WL in the DRAM memory array.

Example 4 includes the IC structure of Example 1, wherein the BL is included in a backend layer of an interlayer dielectric layer (ILD) of a DRAM memory array.

Example 5 includes the IC structure of Example 1, further comprising an etch stop (ES) layer under the channel layer.

Example 6 includes the IC structure of any one of Examples 1-5, wherein the channel includes at least one of amorphous silicon, polycrystalline silicon (poly-Si) polycrystalline germanium (poly-Ge), polycrystalline silicon germanium (poly-SiGe), gallium nitride (GaN), indium gallium arsenide (In GaAs), a transition metal dichalcogenide, or an oxide semiconductor.

Example 7 includes a method for fabricating a memory array, comprising: forming a bitline (BL) to extend along a first direction; depositing a channel layer in an area above the BL to extend along a second direction diagonal to the first direction of the BL; and forming a wordline (WL) extending in a third direction perpendicular to the first direction of the BL and intersecting with the channel layer to control a current across the channel layer along a gated channel length, wherein the channel layer is to electrically couple on a first side to a storage capacitor via a storage node contact (SNC) above both the BL and the WL and on a second side to the BL via a bit line contact (BLC) located on an underside or backside of the channel layer.

Example 8 includes the method of Example 7, wherein forming the channel layer comprises depositing at least one of amorphous silicon, polycrystalline silicon (poly-Si) polycrystalline germanium (poly-Ge), polycrystalline silicon germanium (poly-SiGe), gallium nitride (GaN), indium gallium arsenide (In GaAs), a transition metal dichalcogenide, or an oxide semiconductor over a substrate above the BL.

Example 9 includes the method of Example 8, further comprising depositing an etch stop (ES) layer over the substrate, prior to depositing the channel layer.

Example 10 includes the method of Example 7, wherein the channel layer changes direction at one end of the channel layer to extend in a perpendicular direction towards the storage capacitor.

Example 11 includes the method of Example 7, wherein the ES layer comprises one or more of silicon nitride (SiN), silicon (Si), silicon carbide (SiC), silicon oxynitride (SiON), cadmium oxide (CDO,) aluminum oxide ($Al_2O_3$), hafnium oxide ($HfO_2$), and zirconium oxide ($ZrO_2$).

Example 12 includes the method of any one of Examples 7-11, wherein forming the BL includes forming a BL for a backend layer of a DRAM memory array.

Example 13 includes a computing device, comprising: a board; a component coupled to the board, the component including an integrated circuit (IC) structure, comprising: a bitline (BL) extending along a first direction; a channel extending along a second direction above and diagonal to the BL; and a wordline (WL) extending in a third direction perpendicular to the first direction of the BL and intersecting with the channel to control the channel along a gated channel length, wherein the channel is electrically coupled on a first side to a storage capacitor via a storage node contact (SNC) above the BL and the WL and the channel is further coupled on a second side to the BL via a bit line contact (BLC) located on an underside or backside of the channel.

Example 14 includes the computing device of Example 13, wherein the IC structure comprises a 1T-1C memory cell of a DRAM memory array.

Example 15 includes the computing device of Example 13, further comprising the storage capacitor and wherein the channel changes direction at one end of the channel to extend in a perpendicular direction towards the storage capacitor.

Example 16 includes the computing device of Example 13, further comprising a memory coupled to the board.

Example 17 includes the computing device of Example 13, further comprising a communication chip coupled to the board.

Example 18 includes the computing device of Example 13, wherein the component is a dual-in-line-memory module (DIMM).

Example 19 includes the computing device of Example 13, wherein the component is a packaged integrated circuit die.

Example 20 includes the computing device of any one of Examples 13-19, wherein the component comprises a dynamic-random access memory (DRAM).

What is claimed is:

1. An integrated circuit (IC) structure in a memory device, comprising:
   a bitline (BL) extending in a first direction;
   a channel extending in a second diagonal direction to the BL; and
   a wordline (WL) extending in a third direction perpendicular to the first direction of the BL and intersecting with the channel to control the channel along a gated channel length, wherein the channel is electrically coupled on a first side to a storage capacitor via a storage node contact (SNC) and on a second side to the BL via a bit line contact (BLC) located on an underside or backside of the channel, wherein the channel has a bottommost surface above an uppermost surface of the BL, and the channel has an uppermost surface above an uppermost surface of the WL.

2. The IC structure of claim 1, wherein the IC structure comprises a 1 Transistor-1 Capacitor (1T-1C) memory cell of a dynamic random-access memory (DRAM) array.

3. The IC structure of claim 2, wherein the BLC is located on the underside or backside of the channel relative to a gate oxide of a transistor on a frontside of the channel along the gated channel length.

4. The IC structure of claim 1, wherein the BL is included in a backend layer of an interlayer dielectric layer (ILD) of a dynamic random-access memory (DRAM) array.

5. The IC structure of claim 1, further comprising an etch stop (ES) layer under the channel.

6. The IC structure of claim 1, wherein the channel includes at least one of amorphous silicon, polycrystalline silicon (poly-Si), polycrystalline germanium (poly-Ge), polycrystalline silicon germanium (poly-SiGe), gallium nitride (GaN), indium gallium arsenide (In GaAs), a transition metal dichalcogenide, or an oxide semiconductor.

7. A method for fabricating a memory array, comprising:
forming a bitline (BL) to extend along a first direction;
depositing a channel layer in an area above the BL to extend along a second direction diagonal to the first direction of the BL; and
forming a wordline (WL) extending in a third direction perpendicular to the first direction of the BL and intersecting with the channel layer to control a current across the channel layer along a gated channel length, wherein the channel layer is to electrically couple on a first side to a storage capacitor via a storage node contact (SNC) above both the BL and the WL and on a second side to the BL via a bit line contact (BLC) located on an underside or backside of the channel layer, wherein the channel has a bottommost surface above an uppermost surface of the BL, and the channel has an uppermost surface above an uppermost surface of the WL.

8. The method of claim 7, wherein forming the channel layer comprises depositing at least one of amorphous silicon, polycrystalline silicon (poly-Si), polycrystalline germanium (poly-Ge), polycrystalline silicon germanium (poly-SiGe), gallium nitride (GaN), indium gallium arsenide (In GaAs), a transition metal dichalcogenide, or an oxide semiconductor over a substrate above the BL.

9. The method of claim 8, further comprising depositing an etch stop (ES) layer over the substrate, prior to depositing the channel layer.

10. The method of claim 9, wherein the ES layer comprises one or more of silicon nitride (SiN), silicon (Si), silicon carbide (SiC), silicon oxynitride (SiON), cadmium oxide (CDO), aluminum oxide ($Al_2O_3$), hafnium oxide ($HfO_2$), and zirconium oxide ($ZrO_2$).

11. The method of claim 7, wherein the channel layer changes direction at one end of the channel layer to extend in a perpendicular direction to the second direction and towards the storage capacitor.

12. The method of claim 7, wherein forming the BL includes forming the BL for a backend layer of a DRAM memory array.

13. A computing device, comprising:
a board;
a component coupled to the board, the component including an integrated circuit (IC) structure, comprising:
a bitline (BL) extending along a first direction;
a channel extending along a second direction above and diagonal to the BL; and
a wordline (WL) extending in a third direction perpendicular to the first direction of the BL and intersecting with the channel to control the channel along a gated channel length, wherein the channel is electrically coupled on a first side to a storage capacitor via a storage node contact (SNC) above the BL and the WL and the channel is further coupled on a second side to the BL via a bit line contact (BLC) located on an underside or backside of the channel, wherein the channel has a bottommost surface above an uppermost surface of the BL, and the channel has an uppermost surface above an uppermost surface of the WL.

14. The computing device of claim 13, wherein the IC structure comprises a 1T-1C memory cell of a dynamic random-access memory (DRAM) array.

15. The computing device of claim 13, further comprising the storage capacitor and wherein the channel changes direction at one end of the channel to extend in a perpendicular direction to the second direction and towards the storage capacitor.

16. The computing device of claim 13, further comprising a memory coupled to the board.

17. The computing device of claim 13, further comprising a communication chip coupled to the board.

18. The computing device of claim 13, wherein the component is a dual-in-line-memory module (DIMM).

19. The computing device of claim 13, wherein the component is a packaged integrated circuit die.

20. The computing device of claim 13, wherein the component comprises dynamic random-access memory (DRAM).

* * * * *